United States Patent
Yamazaki et al.

(10) Patent No.: US 11,837,425 B2
(45) Date of Patent: Dec. 5, 2023

(54) MEMS ELEMENT AND ELECTRICAL CIRCUIT

(71) Applicant: KABUSHIKI KAISHA TOSHIBA, Tokyo (JP)

(72) Inventors: Hiroaki Yamazaki, Yokohama Kanagawa (JP); Ping Wang, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/446,033

(22) Filed: Aug. 26, 2021

(65) Prior Publication Data
US 2022/0238290 A1 Jul. 28, 2022

(30) Foreign Application Priority Data
Jan. 22, 2021 (JP) ................. 2021-008399

(51) Int. Cl.
*H01H 59/00* (2006.01)
*B81B 3/00* (2006.01)

(52) U.S. Cl.
CPC ....... *H01H 59/0009* (2013.01); *B81B 3/0086* (2013.01); *B81B 2201/018* (2013.01); *B81B 2203/04* (2013.01); *H01H 2059/0027* (2013.01)

(58) Field of Classification Search
CPC ........ H01H 59/0009; H01H 2059/0027; B81B 3/0086; B81B 2201/018; B81B 2203/04
See application file for complete search history.

(56) References Cited

U.S. PATENT DOCUMENTS

| | | | |
|---|---|---|---|
| 6,998,946 B2 * | 2/2006 | Feng ................. | H01H 59/0009 335/78 |
| 7,119,943 B2 * | 10/2006 | Nelson ............... | H01H 59/0009 359/290 |
| 8,564,928 B2 * | 10/2013 | Ikehashi ............. | H01G 5/16 361/290 |

(Continued)

FOREIGN PATENT DOCUMENTS

| | | |
|---|---|---|
| JP | S59-121730 A | 7/1984 |
| JP | H5-259404 A | 10/1993 |

(Continued)

*Primary Examiner* — Bernard Rojas
(74) *Attorney, Agent, or Firm* — Finnegan, Henderson, Farabow, Garrett & Dunner, LLP

(57) ABSTRACT

According to one embodiment, a MEMS element includes a first member, and an element part. The element part includes a first fixed electrode fixed to the first member, and a first movable electrode facing the first fixed electrode, a first conductive member electrically connected with the first movable electrode, and a second conductive member electrically connected with the first movable electrode. The first movable electrode is supported by the first and second conductive members to be separated from the first fixed electrode in a first state before a first electrical signal is applied between the second conductive member and the first fixed electrode. The first conductive member is separated from the first movable electrode in a second state after the first electrical signal is applied. The first movable electrode is supported by the second conductive member to be separated from the first fixed electrode in the second state.

16 Claims, 12 Drawing Sheets

(56) References Cited

U.S. PATENT DOCUMENTS

| | | | |
|---|---|---|---|
| 2007/0040637 A1* | 2/2007 | Yee | H01H 59/0009 |
| | | | 335/78 |
| 2020/0076394 A1 | 3/2020 | Ikehashi et al. | |
| 2021/0175035 A1* | 6/2021 | Yamazaki | H01H 1/0036 |
| 2022/0084767 A1* | 3/2022 | Yamazaki | H01H 1/0036 |

FOREIGN PATENT DOCUMENTS

| | | |
|---|---|---|
| JP | 2020-35828 A | 3/2020 |
| JP | 2021-91024 A | 6/2021 |

\* cited by examiner

MEMS ELEMENT AND ELECTRICAL CIRCUIT

CROSS-REFERENCE TO RELATED APPLICATIONS

This application is based upon and claims the benefit of priority from Japanese Patent Application No. 2021-008399, filed on Jan. 22, 2021; the entire contents of which are incorporated herein by reference.

FIELD

Embodiments described herein relate generally to a MEMS element and an electrical circuit.

BACKGROUND

For example, a MEMS (Micro Electro Mechanical Systems) element is used in a switch or the like. A stable operation of the MEMS element is desirable.

DETAILED DESCRIPTION

Figure 1A:
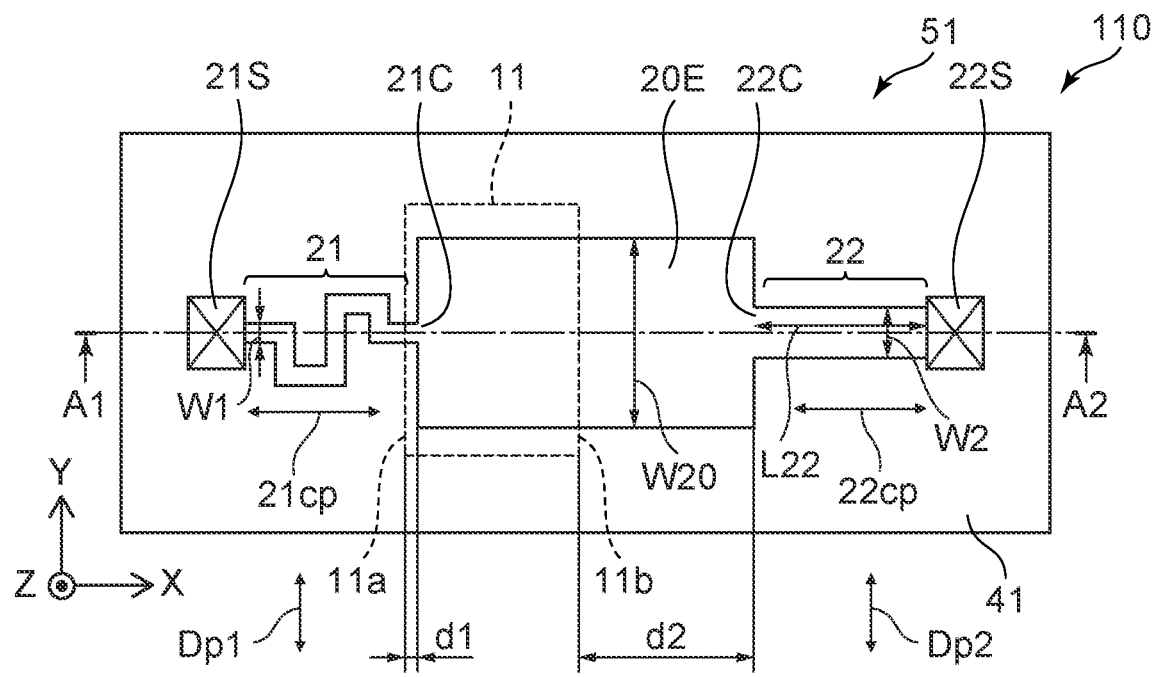
FIGS. 1A and 1B are schematic views illustrating a MEMS element according to a first embodiment.

According to one embodiment, a MEMS element includes a first member, and an element part. The element part includes a first fixed electrode fixed to the first member, and a first movable electrode facing the first fixed electrode, a first conductive member electrically connected with the first movable electrode, and a second conductive member electrically connected with the first movable electrode. The first movable electrode is supported by the first and second conductive members to be separated from the first fixed electrode in a first state before a first electrical signal is applied between the second conductive member and the first fixed electrode. The first conductive member is separated from the first movable electrode in a second state after the first electrical signal is applied between the second conductive member and the first fixed electrode. The first movable electrode is supported by the second conductive member to be separated from the first fixed electrode in the second state.

According to one embodiment, a MEMS element includes a first member, and an element part. The element part includes a first fixed electrode fixed to the first member, a first movable electrode facing the first fixed electrode, a first conductive member electrically connected with the first movable electrode, and a second conductive member electrically connected with the first movable electrode. The first movable electrode includes a first connection part connected with the first conductive member, and a second connection part connected with the second conductive member. A direction from the first connection part toward the second connection part is along a second direction crossing a first direction. The first direction is from the first fixed electrode toward the first movable electrode. The first fixed electrode includes a first fixed end portion and a second fixed end portion. A position in the second direction of the second fixed end portion is between a position in the second direction of the first fixed end portion and a position in the second direction of the second connection part.

According to one embodiment, a MEMS element includes a first member, and an element part. The element part includes a first fixed electrode fixed to the first member, a first movable electrode facing the first fixed electrode, a first conductive member electrically connected with the first movable electrode, and a second conductive member electrically connected with the first movable electrode. The first movable electrode is between the first conductive member and the second conductive member in a second direction crossing a first direction. The first direction is from the first fixed electrode toward the first movable electrode. The first movable electrode includes a first connection part connected with the first conductive member, and a second connection part connected with the second conductive member. A width of the first movable electrode along the second direction increases in an orientation from the first connection part toward the second connection part in at least a portion of the first movable electrode.

According to one embodiment, a MEMS element includes a first member, and an element part. The element part includes a first fixed electrode fixed to the first member, a first movable electrode facing the first fixed electrode, a first conductive member electrically connected with the first movable electrode, a first supporter supporting the first conductive member, and a second supporter supporting the first movable electrode, the second supporter being electrically connected with the first movable electrode. The first movable electrode is supported by the first conductive member and the second supporter to be separated from the first fixed electrode in a first state before a first electrical signal is applied between the second supporter and the first fixed electrode. The first conductive member is separated from the first movable electrode in a second state after the first electrical signal is applied between the second supporter and the first fixed electrode. The first movable electrode is supported by the second supporter to be separated from the first fixed electrode in the second state.

According to one embodiment, an electrical circuit includes the MEMS element described above, and an electrical element electrically connected with the MEMS element.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
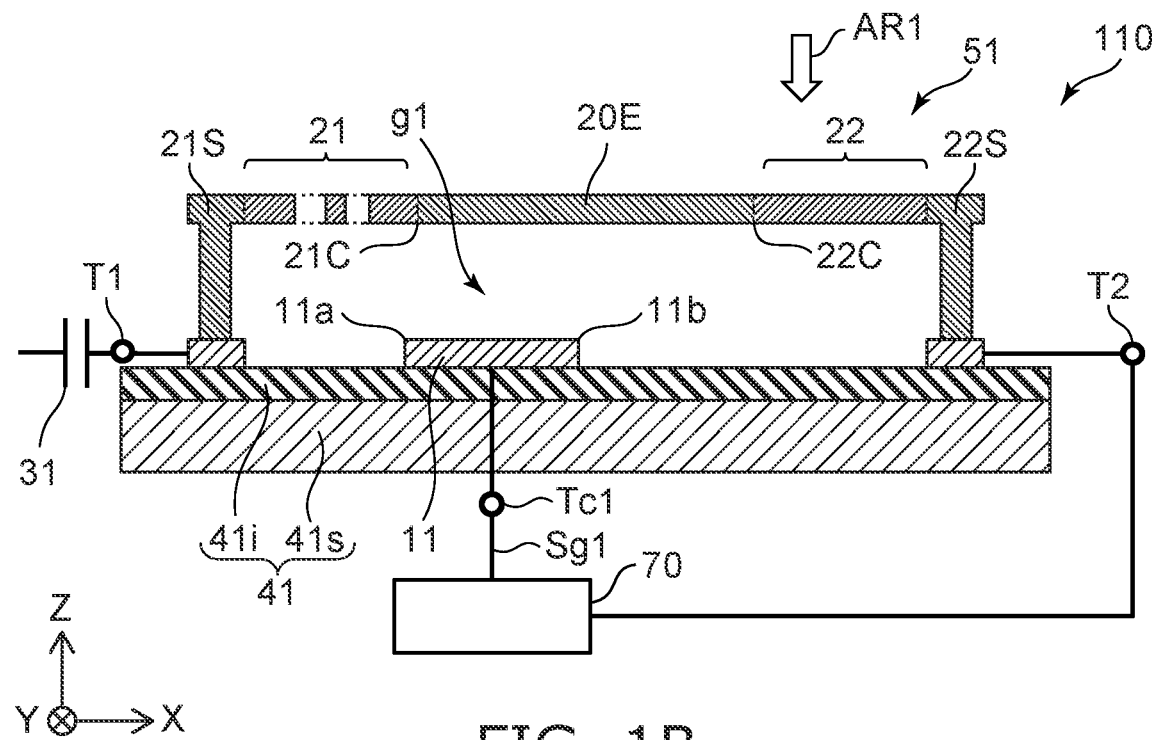

FIGS. 1A and 1B are schematic views illustrating a MEMS element according to a first embodiment.

FIG. 1A is a plan view as viewed along arrow AR1 of FIG. 1B. FIG. 1B is a line A1-A2 cross-sectional view of FIG. 1A.

As shown in FIG. 1B, the MEMS element 110 according to the embodiment includes a first member 41 and an element part 51. The first member 41 is, for example, a base body. In the example, the first member 41 includes a substrate 41s and an insulating layer 41i. The substrate 41s is, for example, a silicon substrate. The substrate 41s may include a control element such as a transistor, etc. The insulating layer 41i is located on the substrate 41s. For example, the element part 51 is located on the insulating layer 41i. According to the embodiment, the first member 41 may include interconnects, etc. (not illustrated). For example, the interconnects electrically connect the element part 51 and the substrate 41s. The interconnects may include contact vias.

As shown in FIGS. 1A and 1B, the element part 51 includes a first fixed electrode 11, a first movable electrode 20E, a first conductive member 21, and a second conductive member 22. The first fixed electrode 11 is fixed to the first member 41. For example, the first fixed electrode 11 is located on the insulating layer 41i.

The first movable electrode 20E faces the first fixed electrode 11. The first conductive member 21 is electrically connected with the first movable electrode 20E. The second conductive member 22 is electrically connected with the first movable electrode 20E.

As described below, for example, a first electrical signal Sg1 (referring to FIG. 1B) can be applied between the second conductive member 22 and the first fixed electrode 11. The state before the first electrical signal Sg1 is applied is taken as a first state (e.g., an initial state). FIGS. 1A and 1B illustrate the first state.

As shown in FIG. 1B, the first movable electrode 20E is supported by the first and second conductive members 21 and 22 to be separated from the first fixed electrode 11 in the first state. For example, a first gap g1 is between the first fixed electrode 11 and the first movable electrode 20E in the first state.

A first direction from the first fixed electrode 11 toward the first movable electrode 20E is taken as a Z-axis direction. One direction perpendicular to the Z-axis direction is taken as an X-axis direction. A direction perpendicular to the Z-axis direction and the X-axis direction is taken as a Y-axis direction.

For example, the direction from the first conductive member 21 toward the second conductive member 22 is along a second direction. The second direction crosses the first direction (the Z-axis direction). The second direction is, for example, the X-axis direction. The first movable electrode 20E is between the first conductive member 21 and the second conductive member 22 in the second direction.

The first movable electrode 20E includes a first connection part 21C and a second connection part 22C. The first connection part 21C is connected with the first conductive member 21. The second connection part 22C is connected with the second conductive member 22. The direction from the first connection part 21C toward the second connection part 22C is along the second direction (e.g., the X-axis direction).

For example, the element part 51 includes a first supporter 21S and a second supporter 22S. The first supporter 21S and the second supporter 22S are fixed to the first member 41. For example, the first supporter 21S and the second supporter 22S are conductive.

In the first state, one end portion of the first conductive member 21 is connected with the first movable electrode 20E; and another end portion of the first conductive member 21 is connected to the first supporter 21S. The first conductive member 21 is supported by the first supporter 21S to be separated from the first member 41.

In the first state, one end portion of the second conductive member 22 is connected with the first movable electrode 20E; and another end portion of the second conductive member 22 is connected to the second supporter 22S. The second conductive member 22 is supported by the second supporter 22S to be separated from the first member 41.

For example, the distance (the length in the Z-axis direction) between the first fixed electrode 11 and the first movable electrode 20E is changeable according to the potential difference between the first fixed electrode 11 and the first movable electrode 20E. The first movable electrode 20E is displaceable when referenced to the first fixed electrode 11.

A first terminal T1 and a second terminal T2 may be provided as shown in FIG. 1B. The first terminal T1 is electrically connected with the first conductive member 21. The second terminal T2 is electrically connected with the second conductive member 22. For example, a current can flow between the first terminal T1 and the second terminal T2 in the first state. At this time, the MEMS element 110 is in a conducting state (e.g., an on-state). As described below, the first conductive member 21 can be broken. In such a case, a current does not flow between the first terminal T1 and the second terminal T2. At this time, the MEMS element 110 is in a nonconducting state (e.g., an off-state).

In the on-state, for example, a current can flow in a first current path 21cp that includes the first conductive member 21 and the first movable electrode 20E (referring to FIG. 1A). In the on-state, for example, a current can flow in a second current path 22cp that includes the second conductive member 22 and the first movable electrode 20E (referring to FIG. 1A).

The MEMS element 110 can function as a normally-on switch element.

The element part 51 may include a first capacitance element 31 (referring to FIG. 1B). For example, the first capacitance element 31 is electrically connected with the first conductive member 21. In the example, the first capacitance element 31 is electrically connected with the first terminal T1. The electrical connection to the first capacitance element 31 can be controlled by controlling the on-state or the off-state of the element part 51.

As shown in FIG. 1B, for example, a controller 70 may be provided. For example, the controller 70 is electrically connected with a first control terminal Tc1 and a second terminal T2. The first control terminal Tc1 is electrically connected with the first fixed electrode 11. The first electrical signal Sg1 can be applied between the second conductive member 22 and the first fixed electrode 11 by the controller 70. The first electrical signal Sg1 includes at least one of a voltage signal or a current signal.

For example, the potential of the second conductive member 22 (e.g., the potential of the second terminal T2) is fixed; and the potential of the first fixed electrode 11 is controllable by the controller 70. According to the embodiment, the potential of the first fixed electrode 11 may be substantially fixed, and the potential of the second conductive member 22 may be controllable by the controller 70. As one example hereinbelow, a case is described where the potential of the second conductive member 22 (e.g., the potential of the second terminal T2) is fixed. In such a case, the potential of the first fixed electrode 11 is controlled by the controller 70. The polarity of the potential difference between the second conductive member 22 and the first fixed electrode 11 is arbitrary.

As described above, the distance between the first fixed electrode 11 and the first movable electrode 20E is reduced by applying a voltage between the second conductive member 22 and the first fixed electrode 11. At this time, according to the embodiment, the distance at the first conductive member 21 side becomes less than the distance at the second conductive member 22 side. For example, such asymmetry is obtained by at least one of the asymmetry of the characteristics of the conductive members, the asymmetry of the position of the first fixed electrode 11, or the asymmetry of the first movable electrode 20E.

In one example, the rigidity of the first conductive member 21 is less than the rigidity of the second conductive member 22. For example, the first conductive member 21 deforms more easily than the second conductive member 22. As described below, such a rigidity difference is obtained by at least one of the material or configuration of the conductive members.

In one example, the first fixed electrode 11 is proximate to the first conductive member 21 side. The position of the first fixed electrode 11 is asymmetric. For example, as described above, the first movable electrode 20E includes the first connection part 21C that is connected with the first conductive member 21, and the second connection part 22C that is connected with the second conductive member 22. The direction from the first connection part 21C toward the second connection part 22C is along the second direction (e.g., the X-axis direction). As shown in FIG. 1A, the first fixed electrode 11 includes a first fixed end portion 11a and a second fixed end portion 11b. The position in the second direction (the X-axis direction) of the second fixed end portion 11b is between the position in the second direction of the first fixed end portion 11a and the position in the second direction of the second connection part 22C. A first distance d1 along the second direction between the first fixed end portion 11a and the first connection part 21C is less than a second distance d2 along the second direction between the second fixed end portion 11b and the second connection part 22C. The first fixed electrode 11 may have such positional asymmetry.

As described below, the first movable electrode 20E may be asymmetric by changing a width W20 of the first movable electrode 20E (referring to FIG. 1A) in the X-axis direction. For example, the distance between the first fixed electrode 11 and the first movable electrode 20E can be asymmetric due to such asymmetry.

An example of a transition from the on-state to the off-state in the MEMS element 110 will now be described. The on-state is, for example, the first state. The off-state is, for example, the second state.

Figure 2A:
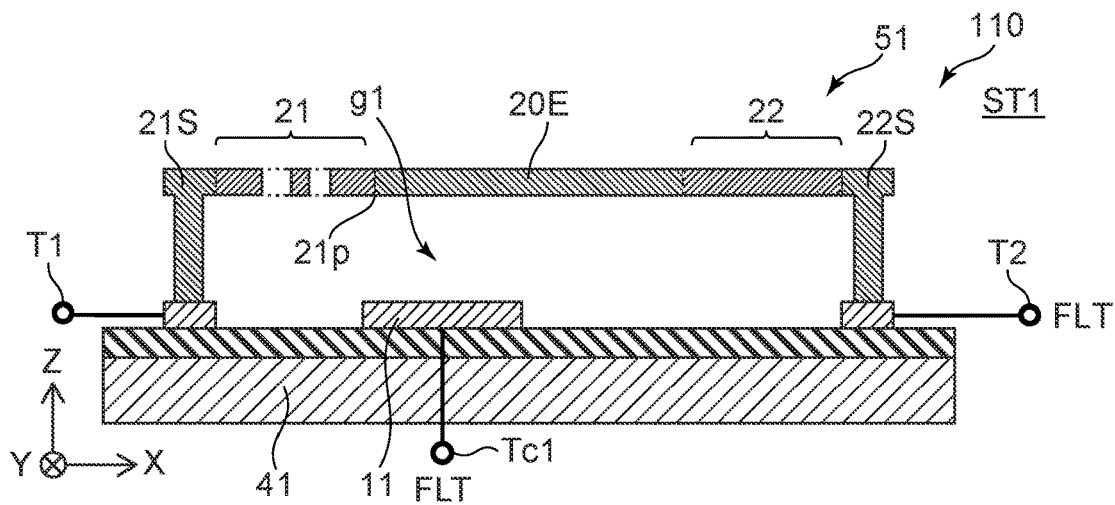
FIGS. 2A to 2D are schematic cross-sectional views illustrating the MEMS element according to the first embodiment.
Figure 2B:
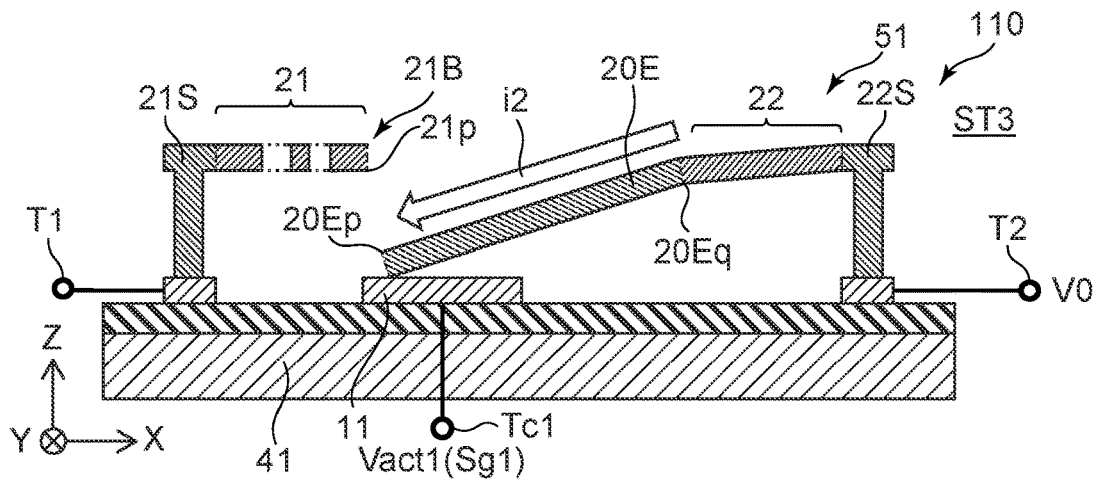
Figure 2C:
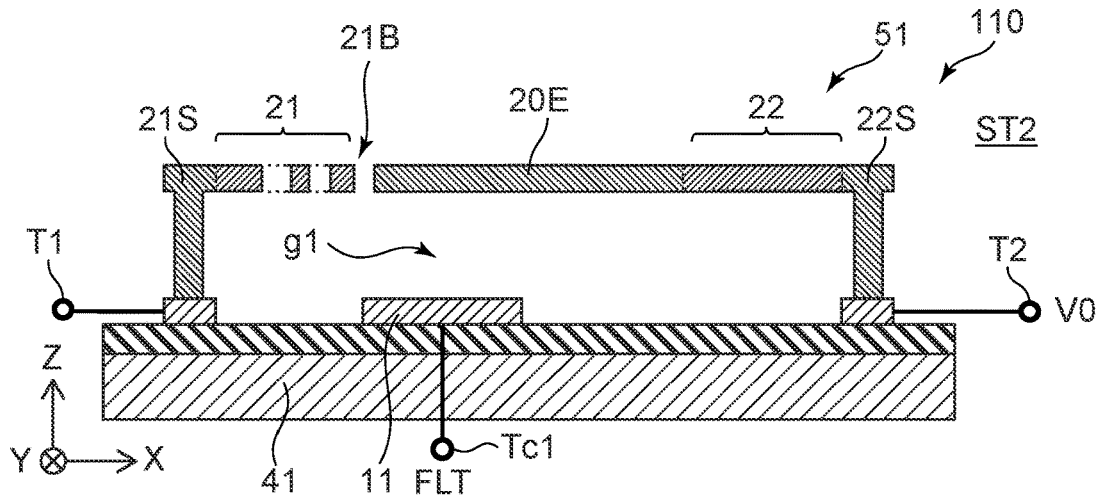

FIGS. 2A to 2C are schematic cross-sectional views illustrating the MEMS element according to the first embodiment.

These drawings illustrate the change of the element part 51 when the first electrical signal Sg1 is applied between the second conductive member 22 and the first fixed electrode 11. As described above, the first electrical signal Sg1 is supplied by the controller 70.

The first state ST1 shown in FIG. 2A is a state before the first electrical signal Sg1 is applied between the second conductive member 22 and the first fixed electrode 11. For example, the second conductive member 22 and the first fixed electrode 11 are in a floating state FLT. At this time, the first movable electrode 20E is separated from the first fixed electrode 11. In such a first state ST1, a current can flow between the first terminal T1 and the second terminal T2. In the first state ST1, the element part 51 is in the conducting state (the on-state). In the first state ST1, the potential difference between the second conductive member 22 and the first fixed electrode 11 may be less than a pull-in voltage. The pull-in voltage is, for example, the voltage when at least a portion of the first movable electrode 20E or at least a portion of the first conductive member 21 contacts the first fixed electrode 11.

As shown in FIG. 2B, for example, the second terminal T2 (the second conductive member 22) is set to a ground potential V0; and the first electrical signal Sg1 (a first operating voltage Vact1) is applied to the first fixed electrode 11. The state in which the first electrical signal Sg1 is applied is taken as a third state ST3. The third state ST3 is the operating state. In the third state ST3, the first movable electrode 20E approaches the first fixed electrode 11. For example, the first movable electrode 20E is easily tilted due to asymmetry such as that described above. For example, compared to an end portion 20Eq of the first movable electrode 20E at the second conductive member 22 side, an end portion 20Ep of the first movable electrode 20E at the first conductive member 21 side approaches the first fixed electrode 11. For example, an end portion 21p of the first conductive member 21 may contact the first fixed electrode 11. Thereby, a current i2 flows between the first movable electrode 20E and the first fixed electrode 11. The temperature easily increases locally at the end portion 20Ep and the end portion 21p. For example, the increase of the temperature is due to Joule heat.

The first conductive member 21 is separated from the first movable electrode 20E when the temperature of the end portions 20Ep and 21p locally increases. For example, the first conductive member 21 breaks. As shown in FIG. 2B, a break portion 21B occurs in the first conductive member 21. The first conductive member 21 is divided at the break portion 21B.

The second state ST2 shown in FIG. 2C is a state after the first electrical signal Sg1 is applied between the second conductive member 22 and the first fixed electrode 11. For example, in the second state ST2, the first fixed electrode 11 is in the floating state FLT. In the second state ST2, the first movable electrode 20E is separated from the first fixed electrode 11. For example, this is due to the restoring force of the second conductive member 22. In the second state ST2, the first movable electrode 20E is supported by the second conductive member 22 to be separated from the first fixed electrode 11. In the second state ST2, the first gap g1 is between the first fixed electrode 11 and the first movable electrode 20E. In the second state ST2, the second conductive member 22 is connected with the first movable electrode 20E.

In the second state ST2, the breakage of the first conductive member 21 continues even after the application of the first electrical signal Sg1 has ended. In the second state ST2, a current does not flow between the first terminal T1 and the second terminal T2. In the second state ST2, the element part 51 is in the nonconducting state (the off-state). For example, in the second state ST2, the second conductive member 22 is in the floating state FLT. Or, in the second state ST2, the potential of the second conductive member 22 may be the potential of a circuit that is connected to the second conductive member 22.

Thus, in the second state ST2 according to the embodiment, the first conductive member 21 is separated from the first movable electrode 20E; and the first movable electrode 20E is supported by the second conductive member 22 to be separated from the first fixed electrode 11. The current that flows between the first terminal T1 and the second terminal T2 can be stably blocked. For example, the element part 51 of the MEMS element 110 can function as a OTP (One Time Programmable) element.

A reference example may be considered in which the second conductive member 22 is broken. For example, in a first reference example, the first conductive member 21 that is connected with the first terminal T1 remains connected with the first movable electrode 20E after breaking the second conductive member 22. In the first reference example, the end portion 21p of the first conductive member 21 continues to contact the first fixed electrode 11 after the application of the first electrical signal Sg1 has ended. For example, when a transistor that controls the application of the first electrical signal Sg1 to the first fixed electrode 11 or the like is connected with the first fixed electrode 11, the parasitic capacitance of the transistor remains even after the application of the first electrical signal Sg1 has ended. The parasitic capacitance of the transistor affects the capacitance of the first terminal T1. In the first reference example, such an unnecessary capacitance remains in the element part 51. The remaining capacitance easily causes unstable electrical characteristics in the off-state of the element part 51 that functions as a switch. For example, when the signal of the circuit in which the element part 51 is embedded has a high frequency, the remaining capacitance makes the characteristics of the element part 51 unstable.

According to the embodiment, the first conductive member 21 is in a broken state in the second state ST2. Therefore, the first terminal T1 is separated from the first fixed electrode 11 and the parasitic capacitance of the transistor. The electrical characteristics of the element part 51 in the off-state are stabilized thereby. Stable off-characteristics can be maintained even for high frequency switching. According to the embodiment, a MEMS element can be provided in which stable operations are possible.

According to the embodiment, for example, as shown in FIG. 1A, a portion of the first conductive member 21 may overlap the first fixed electrode 11 in the Z-axis direction. For example, when a portion of the first conductive member 21 overlaps the first fixed electrode 11 in the Z-axis direction, the portion of the first conductive member 21 easily contacts the first fixed electrode 11 when the first movable electrode 20E approaches the first fixed electrode 11. For example, a current locally flows between the first fixed electrode 11 and the portion of the first conductive member 21. The first conductive member 21 is more stably broken by the current concentrating in the portion of the first conductive member 21. For example, the mechanical rigidity of the first conductive member 21 is less than the mechanical rigidity of the first movable electrode 20E. Thereby, the end portion 20Ep of the first movable electrode 20E or the end portion 21p of the first conductive member 21 easily contacts the first fixed electrode 11.

As shown in FIG. 1A, for example, the width (a first width W1) of the first conductive member 21 is less than the width W20 of the first movable electrode 20E. The width W20 is the length along the Y-axis direction of the first movable electrode 20E. Thereby, the first conductive member 21 deforms more easily than the first movable electrode 20E.

In the example as shown in FIG. 1A, the width (the first width W1) of at least a portion of the first conductive member 21 is less than the width (a second width W2) of at least a portion of the second conductive member 22. The first conductive member 21 deforms more easily than the second conductive member 22.

The first width W1 is the length of the at least a portion of the first conductive member 21 along a first cross direction Dp1 that crosses the extension direction of the first conductive member 21 (referring to FIG. 1A). The second width W2 of the second conductive member 22 is the length of the at least a portion of the second conductive member 22 along a second cross direction Dp2 that crosses the extension direction of the second conductive member 22 (referring to FIG. 1A). The first conductive member 21 and the second conductive member 22 are spring members. For example, it is favorable for the first width W1 to be not more than 0.5 times the second width W2. Thereby, the breaking of the first conductive member 21 and the non-breaking of the second conductive member 22 are stable.

As shown in FIG. 1A, the second conductive member 22 has a second length L22 along the second current path 22cp that includes the second conductive member 22 and the first movable electrode 20E. In the example, the second length L22 is the length along the X-axis direction of the second conductive member 22.

In the example as shown in FIG. 1A, the first conductive member 21 has a meandering structure. An example of the length of the first conductive member 21 will now be described.

Figure 3:
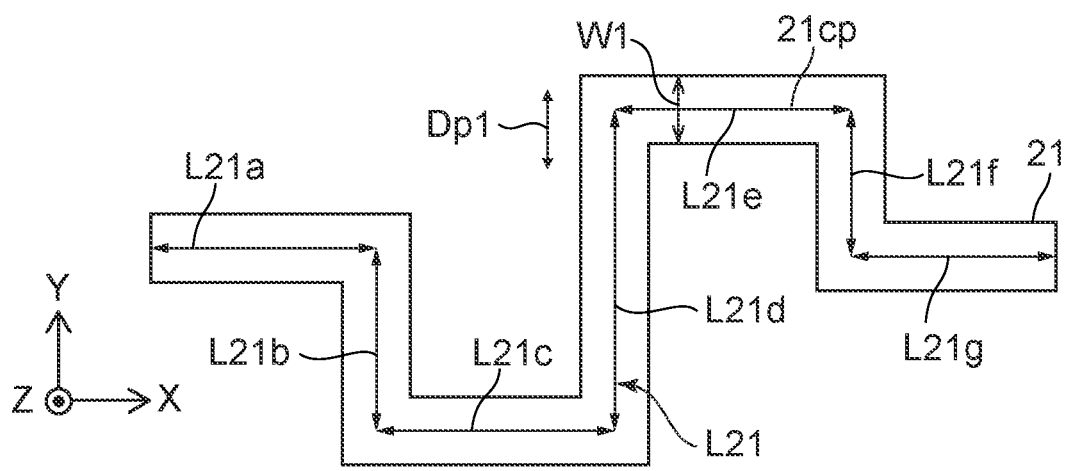
FIG. 3 is a schematic plan view illustrating a portion of the MEMS element according to the first embodiment.

FIG. 3 is a schematic plan view illustrating a portion of the MEMS element according to the first embodiment.

FIG. 3 illustrates the first conductive member 21. The first conductive member 21 has a first length L21 along the first current path 21cp that includes the first conductive member 21 and the first movable electrode 20E. The first length L21 corresponds to the sum of the lengths L21a to L21g.

For example, the second length L22 (referring to FIG. 1A) is less than the first length L21. In such a case as well, the rigidity of the first conductive member 21 is less than the rigidity of the second conductive member 22. Thereby, the characteristics of the first conductive member 21 are asymmetric with the characteristics of the second conductive member 22.

Figure 4:
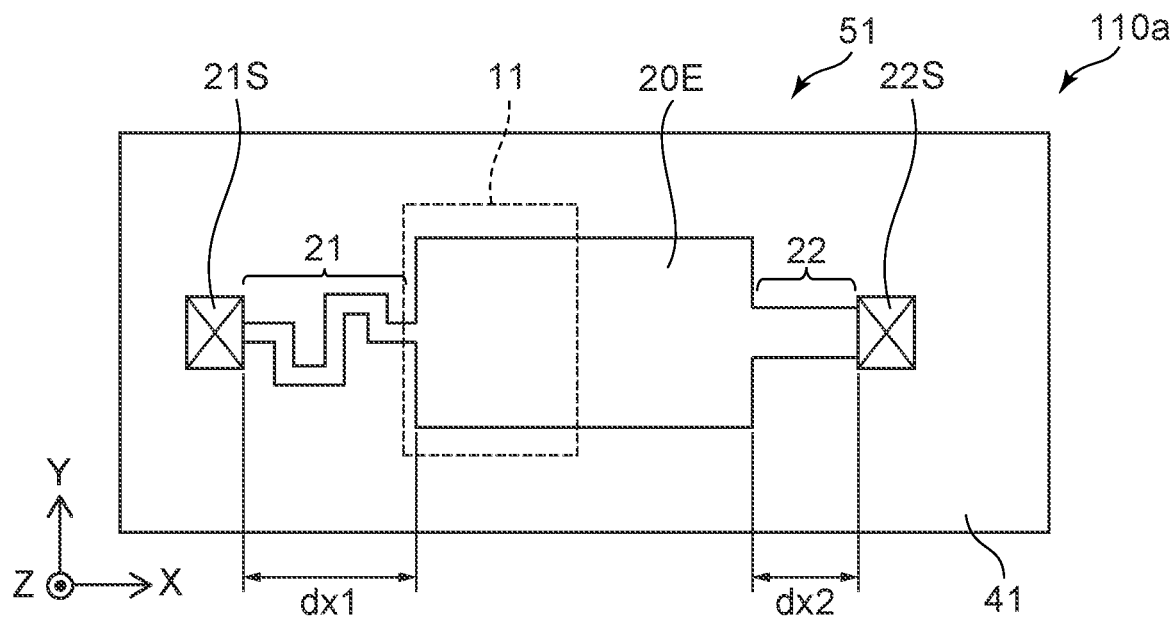
FIG. 4 is a schematic plan view illustrating a MEMS element according to the first embodiment.

FIG. 4 is a schematic plan view illustrating a MEMS element according to the first embodiment.

In the MEMS element 110a according to the embodiment as shown in FIG. 4, a distance dx1 along the X-axis direction (the second direction) between the first supporter 21S and the first movable electrode 20E is greater than a distance dx2 along the X-axis direction between the first movable electrode 20E and the second supporter 22S. The rigidity of the first conductive member 21 is less than the rigidity of the second conductive member 22.

Figure 5:
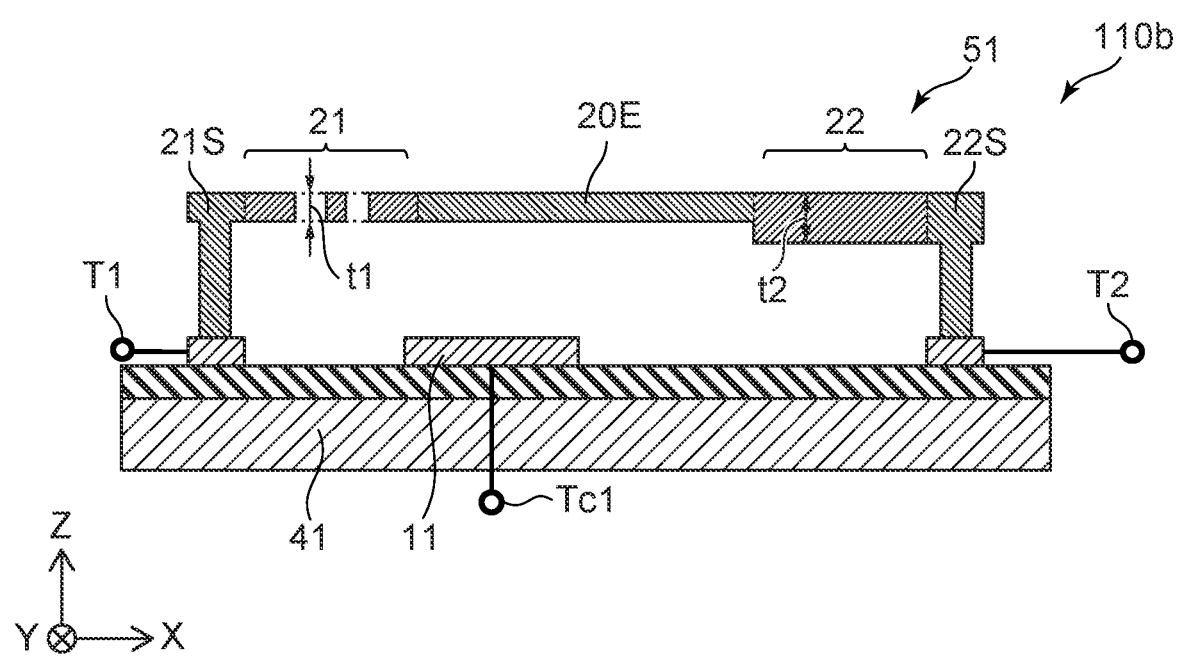
FIG. 5 is a schematic plan view illustrating a MEMS element according to the first embodiment.

FIG. 5 is a schematic plan view illustrating a MEMS element according to the first embodiment.

In the MEMS element 110b according to the embodiment as shown in FIG. 5, a first thickness t1 of the first conductive member 21 is less than a second thickness t2 of the second conductive member 22. The first thickness t1 is the length of the first conductive member 21 along the first direction (the Z-axis direction) in the first state ST1. The second thickness t2 is the length of the second conductive member 22 along the first direction in the first state ST1. Such a thickness difference causes the characteristics of the first conductive member 21 to be asymmetric with the characteristics of the second conductive member 22.

Figure 6A:
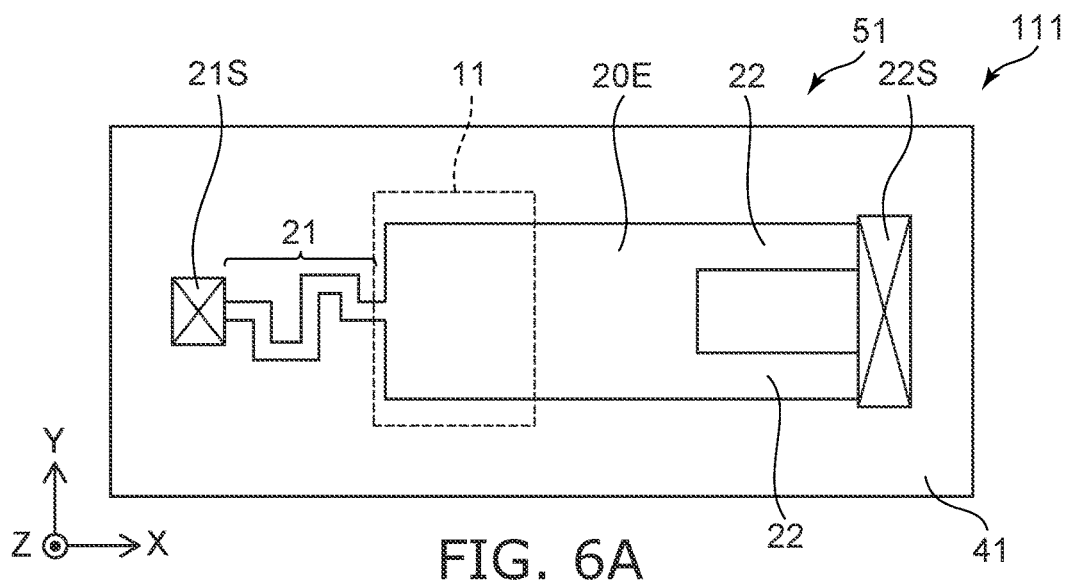
FIGS. 6A to 6C are schematic plan views illustrating MEMS elements according to the first embodiment.
Figure 6B:
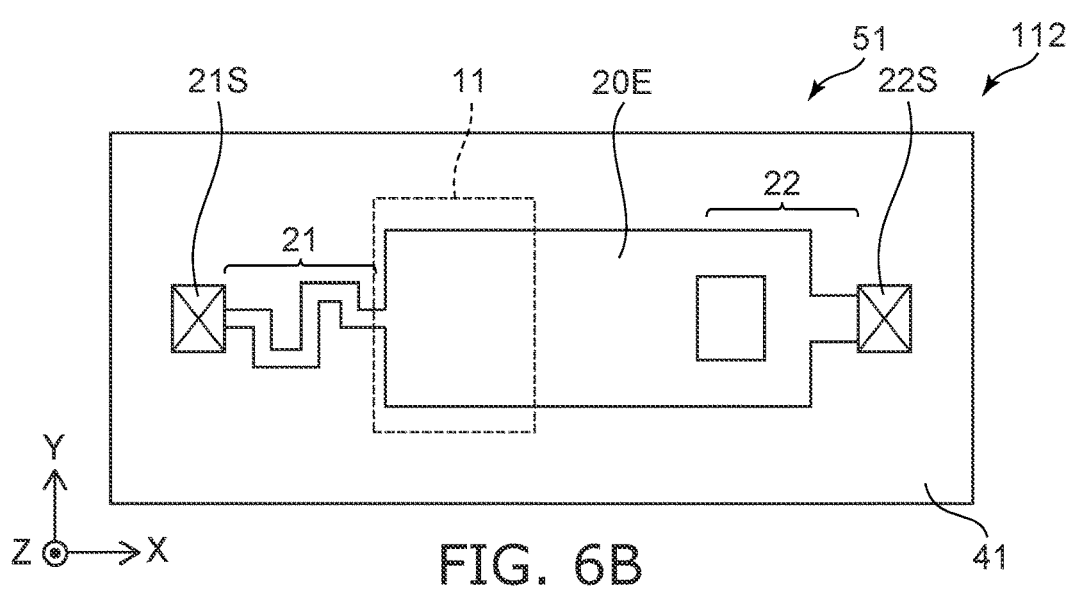
Figure 6C:
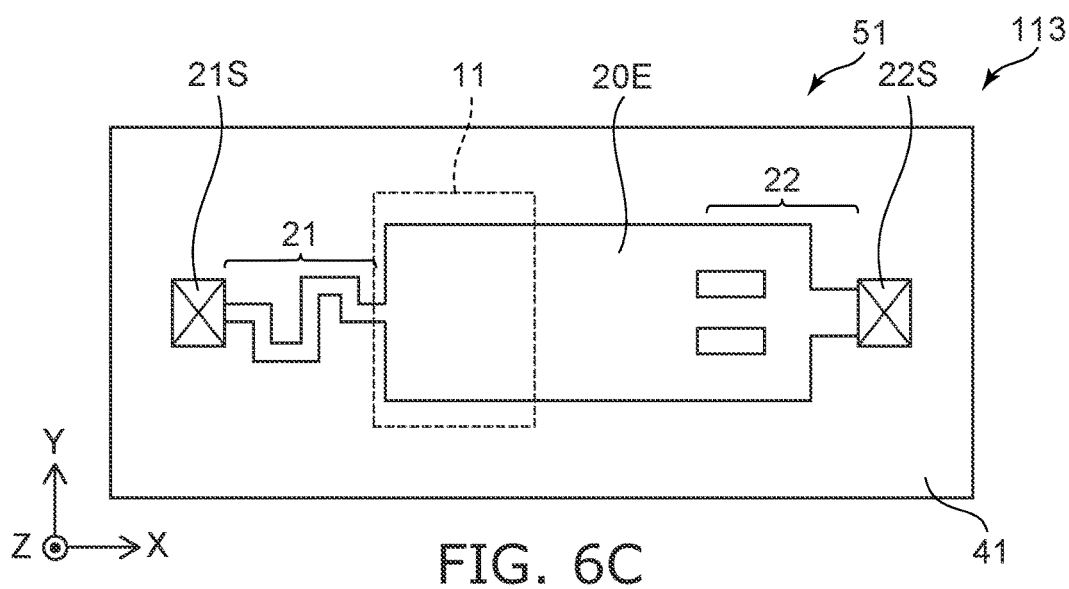

FIGS. 6A to 6C are schematic plan views illustrating MEMS elements according to the first embodiment.

As shown in FIG. 6A, multiple second conductive members 22 are included in a MEMS element 111 according to the embodiment. A hole may be considered to be provided in one second conductive member 22.

As shown in FIGS. 6B and 6C, the second conductive member 22 includes multiple branching portions in MEMS elements 112 and 113 according to the embodiment. The multiple portions may be connected to the end portion in the Y-axis direction of the first movable electrode 20E. A stable support is obtained. A hole may be considered to be provided in one second conductive member 22. The number of multiple portions may be three or more.

For example, in the MEMS elements 110, 110a, 110b, and 111 to 113 as described above, the first fixed electrode 11 may be located at an asymmetric position in the X-axis direction. For example, as described with reference to FIG. 1A, the first distance d1 along the second direction (the X-axis direction) between the first fixed end portion 11a and the first connection part 21C is less than the second distance d2 along the second direction between the second fixed end portion 11b and the second connection part 22C. Thereby, stable operations are possible. In one example, the first distance d1 is not less than 0.001 times and not more than 0.5 times the second distance d2. The first distance d1 may be not less than 0.01 times the second distance d2. According to the embodiment, the first distance d1 may be greater than the second distance d2 when the first fixed electrode 11 is located at an asymmetric position between the first supporter 21S and the second supporter 22S.

When the first fixed electrode 11 is located at an asymmetric position in the X-axis direction, the first movable electrode 20E is supported by the first and second conductive members 21 and 22 to be separated from the first fixed electrode 11 in the first state ST1 before the first electrical signal Sg1 is applied. When the first fixed electrode 11 is located at an asymmetric position in the X-axis direction, the first conductive member 21 is easily separated from the first movable electrode 20E in the second state ST2 after the first electrical signal Sg1 is applied. In such a case as well, the first movable electrode 20E is supported by the second conductive member 22 to be separated from the first fixed electrode 11.

Figure 2D:
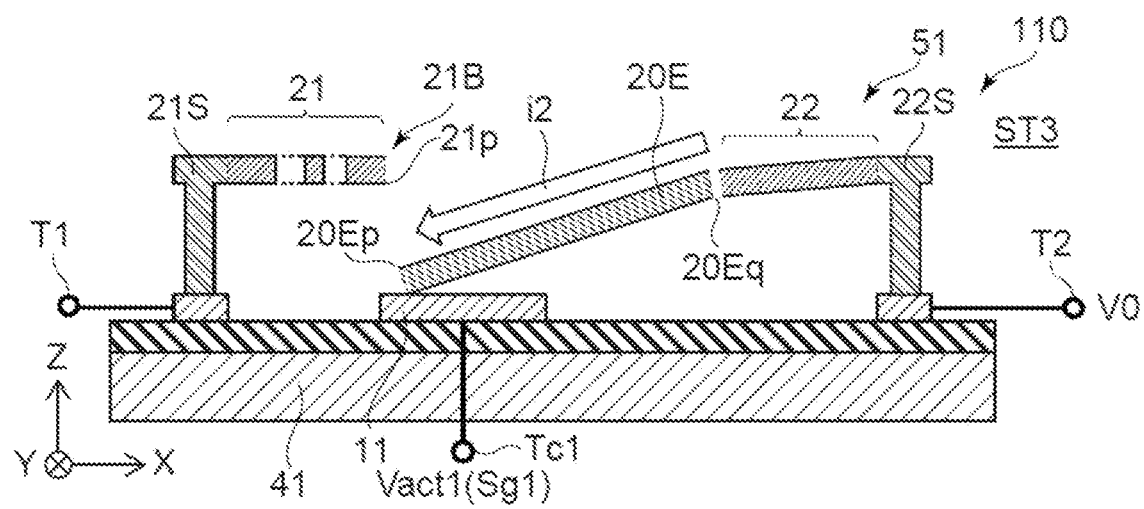

For example, when the first fixed electrode 11 is located at an asymmetric position in the X-axis direction, the first conductive member 21 and the second conductive member 22 may be separated from the first movable electrode 20E in the second state ST2 after the first electrical signal Sg1 is applied. For example, when the first electrical signal Sg1 is applied for a long period of time in the operating state (the third state ST3), etc., both the first conductive member 21 and the second conductive member 22 may break, as shown in FIG. 2D. In such a case as well, the first terminal T1 is separated from the first fixed electrode 11 and the parasitic capacitance of the transistor. Thereby, the electrical characteristics of the element part 51 in the off-state are stable. Stable off-characteristics can be maintained even when a high frequency signal is applied. According to the embodiment, a MEMS element can be provided in which stable operations are possible.

Figure 7:
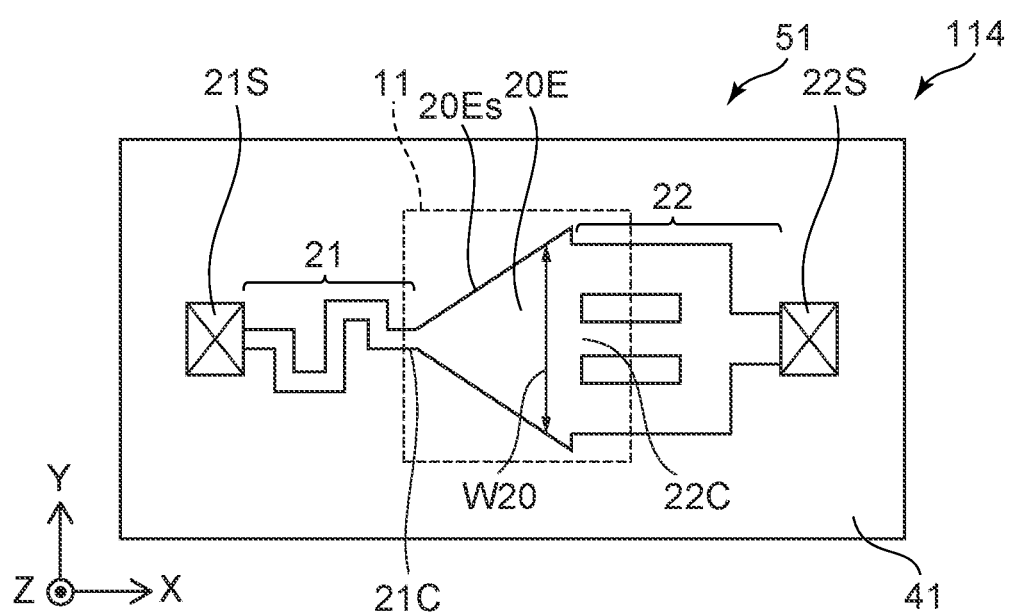
FIG. 7 is a schematic plan view illustrating a MEMS element according to the first embodiment.

FIG. 7 is a schematic plan view illustrating a MEMS element according to the first embodiment.

In the MEMS element 114 according to the embodiment as shown in FIG. 7, the width W20 of the first movable electrode 20E changes. As described above, the first movable electrode 20E includes the first connection part 21C that is connected with the first conductive member 21, and the second connection part 22C that is connected with the second conductive member 22. The direction from the first connection part 21C toward the second connection part 22C is along the second direction (e.g., the X-axis direction) that crosses the first direction (the Z-axis direction) that is from the first fixed electrode 11 toward the first movable electrode 20E. A direction that crosses a plane including the first and second directions is taken as a third direction. The third direction is, for example, the Y-axis direction. The width W20 of the first movable electrode 20E along the third direction increases in the orientation from the first connection part 21C toward the second connection part 22C in at least a portion of the first movable electrode 20E.

By such a configuration, for example, in the third state ST3, compared to the end portion 20Eq of the first movable electrode 20E at the second conductive member 22 side, the end portion 20Ep of the first movable electrode 20E at the first conductive member 21 side approaches the first fixed electrode 11 (referring to FIG. 2B). For example, the end portion 21p of the first conductive member 21 may contact the first fixed electrode 11. In the third state ST3, the end portion 20Eq is separated from the first fixed electrode 11, as shown in FIG. 2D. The first conductive member 21 can stably break. For example, in the second state ST2, the first movable electrode 20E is stably supported by the first conductive member 21 to be separated from the first fixed electrode 11.

In the MEMS element 114 as shown in FIG. 7, the at least a portion of the first movable electrode 20E may include a side portion 20Es that is oblique to the second direction (e.g., the X-axis direction). By providing such a side portion 20Es, the width W20 continuously increases in the orientation from the first connection part 21C toward the second connection part 22C. For example, the side portion 20Es described above is located in at least a portion of the region that is connected to the first conductive member 21 in the first state ST1. By such a configuration, the temperature of the first connection part 21C (or the end portion 21p of the first conductive member 21) can be effectively increased locally. The first conductive member 21 can be stably broken. A MEMS element can be provided in which stable operations are possible.

Figure 8A:
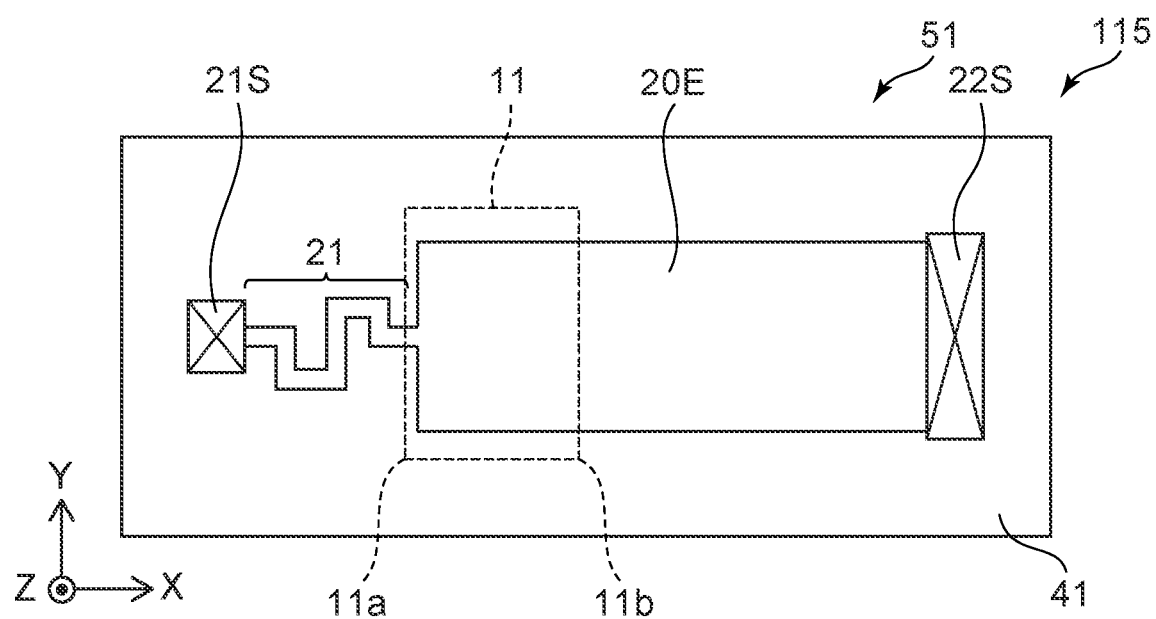
FIGS. 8A and 8B are schematic views illustrating a MEMS element according to the first embodiment.
Figure 8B:
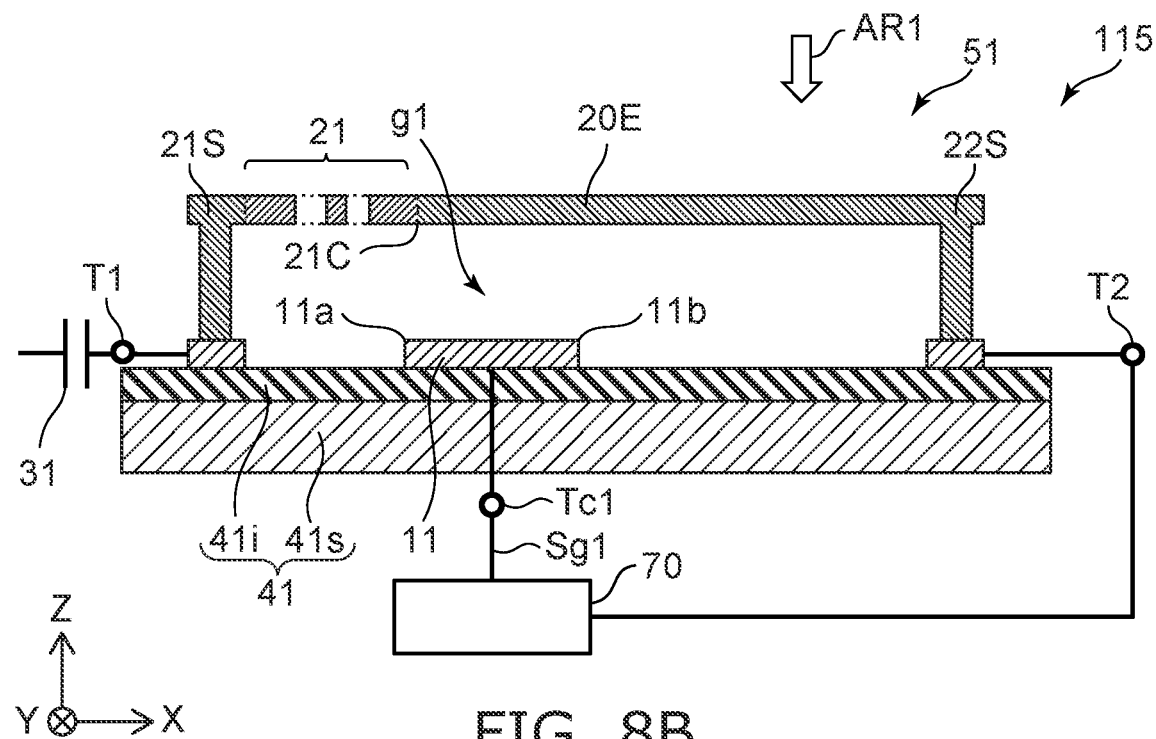

FIGS. 8A and 8B are schematic views illustrating a MEMS element according to the first embodiment.

FIG. 8A is a plan view as viewed along arrow AR1 of FIG. 8B. FIG. 8B is a cross-sectional view.

As shown in FIGS. 8A and 8B, the MEMS element 115 according to the embodiment also includes the first member 41 and the element part 51. In the MEMS element 115, the element part 51 includes the first fixed electrode 11 that is fixed to the first member 41, the first movable electrode 20E that faces the first fixed electrode 11, the first conductive member 21 that is electrically connected with the first movable electrode 20E, the first supporter 21S that supports the first conductive member 21, and the second supporter 22S that supports the first movable electrode 20E and is electrically connected with the first movable electrode 20E. The second conductive member 22 is omitted from the MEMS element 115.

In the MEMS element 115 as well, an operation similar to that of the MEMS element 110 is possible. For example, the first movable electrode 20E is supported by the first conductive member 21 and the second supporter 22S to be separated from the first fixed electrode 11 in the first state ST1 before the first electrical signal Sg1 is applied between the second supporter 22S and the first fixed electrode 11. In the second state ST2 after the first electrical signal Sg1 is applied between the second supporter 22S and the first fixed electrode 11, the first conductive member 21 is separated from the first movable electrode 20E, and the first movable electrode 20E is supported by the second supporter 22S to be separated from the first fixed electrode 11. In the MEMS element 115 as well, a MEMS element can be provided in which stable operations are possible.

Figure 9A:
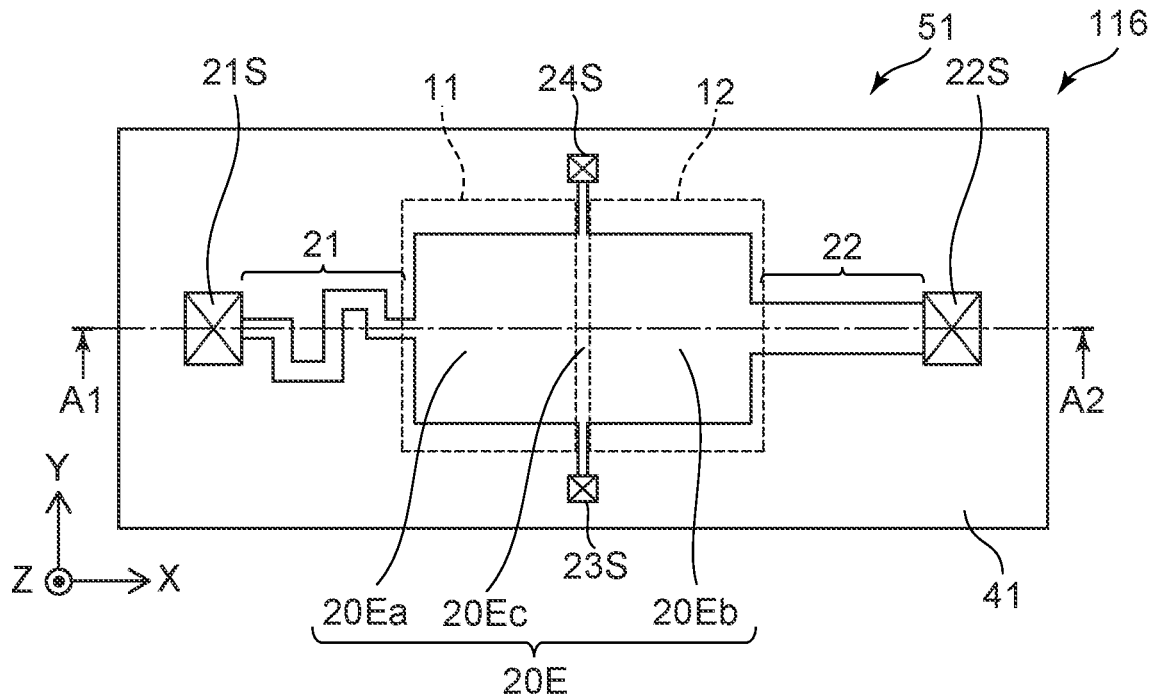
FIGS. 9A and 9B are schematic views illustrating a MEMS element according to the first embodiment.
Figure 9B:
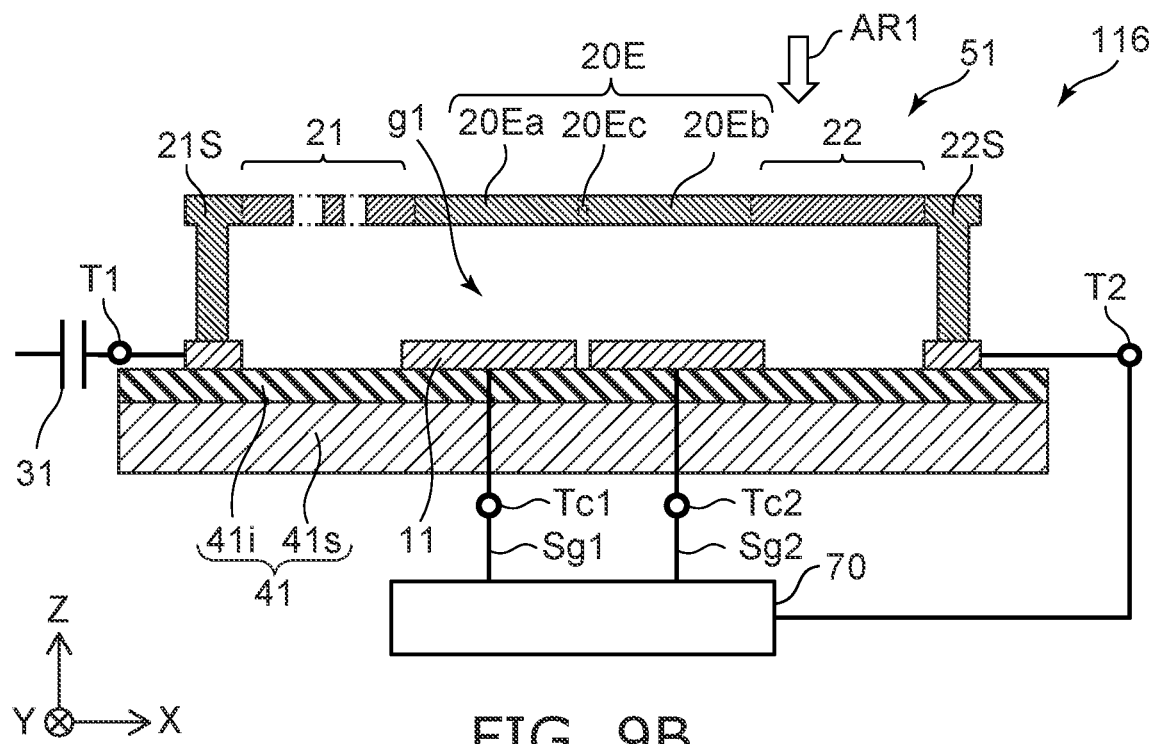

FIGS. 9A and 9B are schematic views illustrating a MEMS element according to the first embodiment.

FIG. 9A is a plan view as viewed along arrow AR1 of FIG. 9B. FIG. 9B is a line A1-A2 cross-sectional view of FIG. 9A.

In the MEMS element 116 according to the embodiment as shown in FIGS. 9A and 9B, the element part 51 includes a third supporter 23S. The element part 51 may further include a fourth supporter 24S. In the example, the element part 51 further includes a second fixed electrode 12. Otherwise, the configuration of the MEMS element 116 may be similar to that of the MEMS element 110.

The third supporter 23S is fixed to the first member 41. The first movable electrode 20E includes a first electrode region 20Ea that is connected with the first conductive member 21 in the first state ST1, a second electrode region 20Eb that is connected with the second conductive member 22 in the first state ST1, and a first middle region 20Ec. The position of the first middle region 20Ec in the second direction (the X-axis direction) is between the position of the first electrode region 20Ea in the second direction and the position of the second electrode region 20Eb in the second direction. For example, the first electrode region 20Ea faces the first fixed electrode 11. For example, the second electrode region 20Eb faces the second fixed electrode 12.

The first middle region 20Ec is supported by the third supporter 23S to be separated from the first member 41. For example, the breakage of the first conductive member 21 is stably obtained.

The fourth supporter 24S is fixed to the first member 41. At least a portion of the first middle region 20Ec is between the third supporter 23S and the fourth supporter 24S in the third direction (a direction that crosses a plane including the first and second directions, e.g., the Y-axis direction). The first middle region 20Ec is supported by the fourth supporter 24S to be separated from the first member 41.

The second fixed electrode 12 is fixed to the first member 41. As described above, the first movable electrode 20E includes the first electrode region 20Ea and the second electrode region 20Eb. The distance between the first electrode region 20Ea and the first conductive member 21 is less than the distance between the second electrode region 20Eb and the first conductive member 21. The distance between the second electrode region 20Eb and the second conductive member 22 is less than the distance between the first electrode region 20Ea and the second conductive member 22. The first movable electrode 20E is supported by the first and second conductive members 21 and 22 to be separated from the second fixed electrode 12.

For example, the MEMS element 116 may include a second control terminal Tc2 that is electrically connected with the second fixed electrode 12. The controller 70 is electrically connectable with the second fixed electrode 12 via the second control terminal Tc2. In the example, the controller 70 is electrically connected with the second conductive member 22 via the second terminal T2. For example, a second electrical signal Sg2 can be applied between the second conductive member 22 and the second fixed electrode 12 by the controller 70.

The on-state and the off-state may be more stably obtained by the first and second electrical signals Sg1 and Sg2.

Figure 10A:
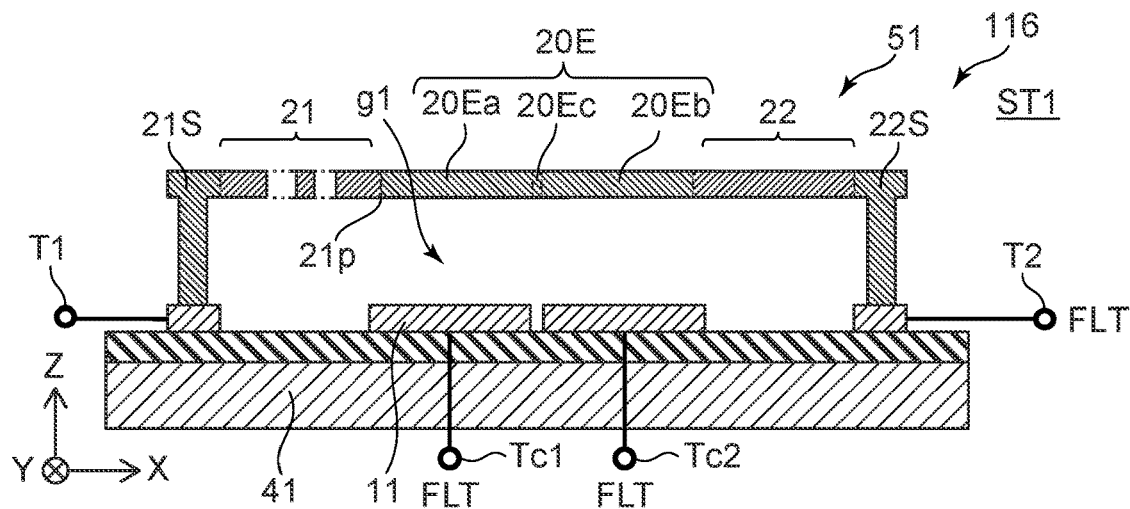
FIGS. 10A to 10C are schematic cross-sectional views illustrating a MEMS element according to the first embodiment.
Figure 10B:
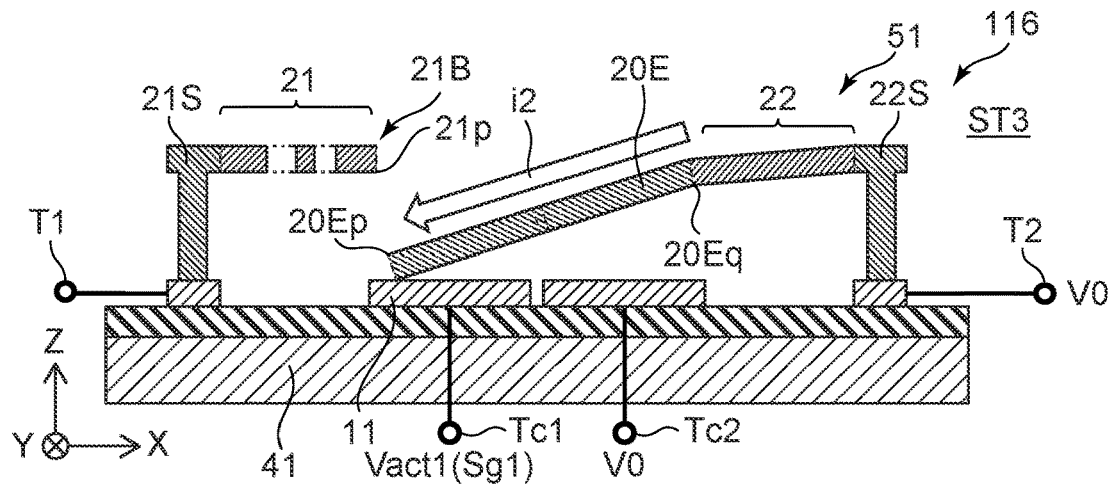
Figure 10C:
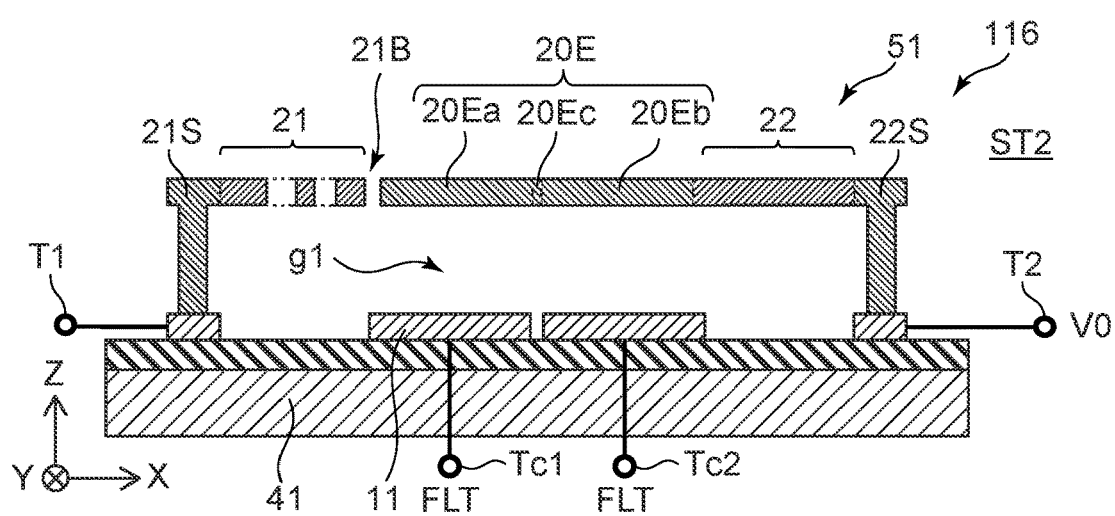

FIGS. 10A to 10C are schematic cross-sectional views illustrating a MEMS element according to the first embodiment.

The first state ST1 shown in FIG. 10A is a state before the first electrical signal Sg1 is applied between the second conductive member 22 and the first fixed electrode 11. For example, the second conductive member 22, the first fixed electrode 11, and the second fixed electrode 12 are in the floating state FLT. In the first state ST1, the potential difference between the second conductive member 22 and the first fixed electrode 11 and the potential difference between the second conductive member 22 and the second fixed electrode 12 may be less than the pull-in voltage.

In the third state ST3 as shown in FIG. 10B, for example, the second terminal T2 (the second conductive member 22) is set to the ground potential V0; and the first electrical signal Sg1 (the first operating voltage Vact1) is applied to the first fixed electrode 11. In the example, the second fixed electrode 12 is set to the ground potential V0. For example, compared to the end portion 20Eq of the first movable electrode 20E at the second conductive member 22 side, the end portion 20Ep of the first movable electrode 20E at the first conductive member 21 side approaches the first fixed electrode 11. For example, the end portion 20Ep and the end portion 21p of the first conductive member 21 contact the first fixed electrode 11. The first conductive member 21 is separated from the first movable electrode 20E and is broken.

As shown in FIG. 10C, for example, the first movable electrode 20E is separated from the first fixed electrode 11 by the restoring force in the second state ST2 after the first electrical signal Sg1 is applied between the second conductive member 22 and the first fixed electrode 11.

In the third state ST3 described above, there are cases where the state of the end portion 20Ep contacting the first fixed electrode 11 may continue after at least one of the end portion 20Ep or the end portion 21p contacts the first fixed electrode 11. For example, there is a possibility that such a state may occur when a compound (e.g., an oxide), etc., forms between the end portion 20Ep and the first fixed electrode 11. At this time, for example, there are cases where the end portion 20Ep is more easily separated from the first fixed electrode 11 by controlling the potential of the second fixed electrode 12. The off-state is more stably obtained thereby.

According to the first embodiment, it is favorable for the electrical resistances of the first and second conductive members 21 and 22 each to be, for example, not more than 10Ω. Because the electrical resistance is low, a signal that includes a high frequency can be efficiently transmitted with low loss.

According to the first embodiment, for example, at least one of the first conductive member 21 or the second conductive member 22 includes at least one selected from the group consisting of Al, Cu, Au, Ti, Pd, Pt, and W. A low resistance is obtained, and good transmission in the element part 51 is obtained.

Figure 11:
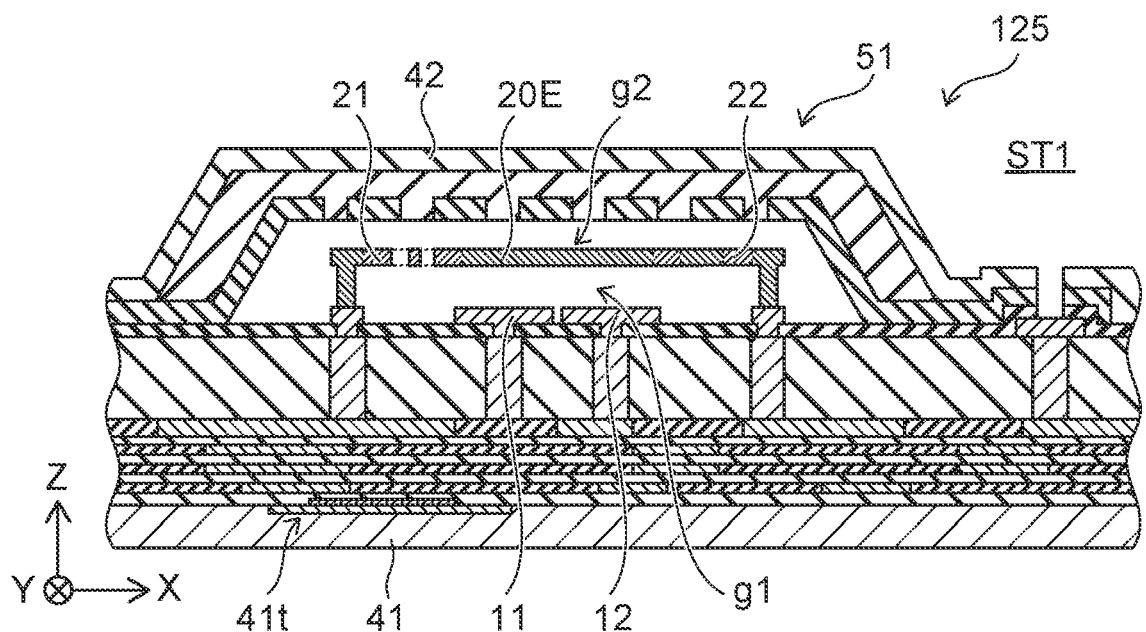
FIG. 11 is a schematic cross-sectional view illustrating a MEMS element according to the first embodiment.

FIG. 11 is a schematic cross-sectional view illustrating a MEMS element according to the first embodiment.

FIG. 11 illustrates the MEMS element 125 according to the first embodiment. FIG. 11 illustrates the first state ST1. As shown in FIG. 11, the MEMS element 125 further includes a second member 42 in addition to the first member 41 and the element part 51. The first fixed electrode 11 and the first movable electrode 20E are between the first member 41 and the second member 42. In the first state ST1, the first gap g1 is between the first fixed electrode 11 and the first movable electrode 20E. In the first state ST1, a second gap g2 is between the first movable electrode 20E and the second member 42. The configuration of the element part 51 of the MEMS element 125 may be a configuration described above.

The second member 42 is, for example, a cap. Due to the first and second gaps g1 and g2, the first movable electrode 20E can be displaced along the Z-axis direction. For example, the first gap g1 and the second gap g2 may be in a reduced-pressure state (less than 1 atmosphere). For example, an inert gas may be introduced to the first gap g1.

For example, the first member 41 may include a control circuit part 41t. The control circuit part 41t includes, for example, a switching element such as a transistor, etc. The application of the first electrical signal Sg1 to the first fixed electrode 11 may be controlled by the control circuit part 41t.

Second Embodiment

Figure 12:
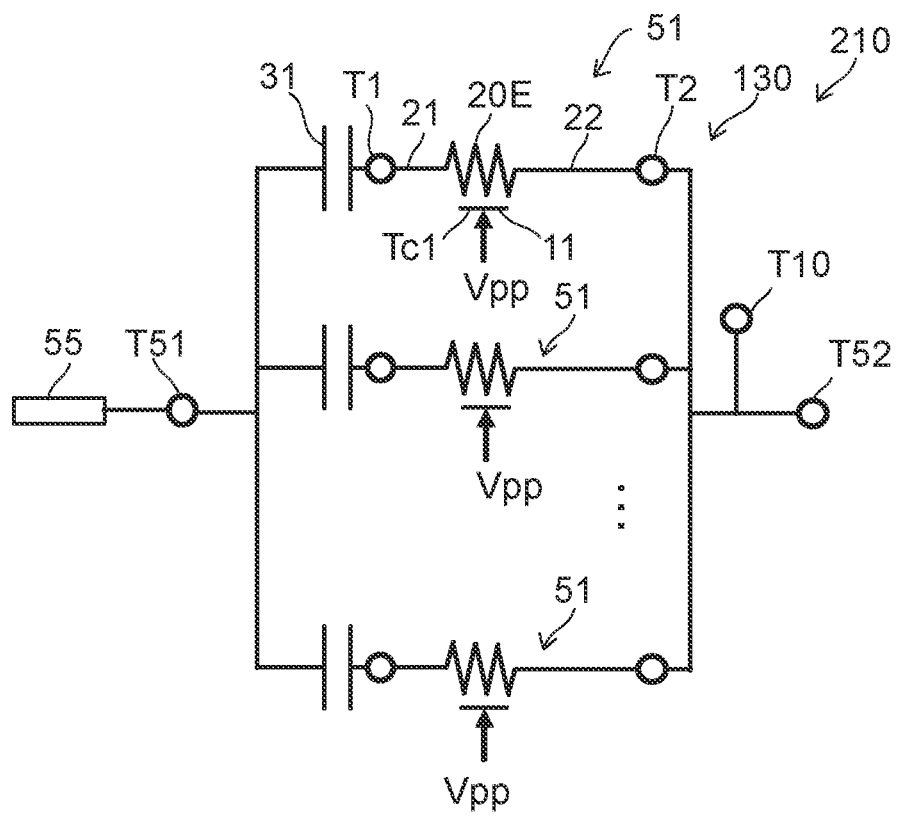
FIG. 12 is a schematic view illustrating a MEMS element according to a second embodiment.

FIG. 12 is a schematic view illustrating a MEMS element according to a second embodiment.

As shown in FIG. 12, the MEMS element 130 according to the embodiment includes multiple element parts 51. For example, the multiple element parts 51 are connected in parallel. A control signal Vpp can be applied independently to each of the multiple element parts 51.

For example, the first conductive member 21 that is included in one of the multiple element parts 51 is breakable independently from the first conductive member 21 that is included in another one of the multiple element parts 51.

Multiple first capacitance elements 31 are provided in the example. One of the multiple first capacitance elements 31 is connected in series to one of the multiple element parts 51. The MEMS element 130 is a capacitance element array that includes the multiple element parts 51 and the multiple first capacitance elements 31. Several of the multiple element parts 51 can be set to the off-state. The electrical capacitance of the MEMS element 130 can be modified by setting several of the multiple element parts 51 to the off-state.

Third Embodiment

A third embodiment relates to an electrical circuit. FIG. 12, which is described above, illustrates the configuration of the electrical circuit 210 according to the embodiment. As shown in FIG. 12, the electrical circuit 210 includes a MEMS element (e.g., the MEMS element 130) according to the embodiment and an electrical element 55. The electrical element 55 is electrically connected with the MEMS element 130. The electrical element 55 includes at least one selected from the group consisting of a resistance, a capacitance element, an inductor element, a diode, and a transistor. The capacitance element that is included in the electrical element 55 may include a sensor. For example, the electrical element 55 may include a sensor element. For example, the electrical element 55 may include a capacitive sensor element.

In the electrical circuit 210, the MEMS element (e.g., the MEMS element 130) may include multiple element parts 51. The characteristics of the electrical circuit 210 are controllable by breaking the first conductive member 21 that is included in at least one of the multiple element parts 51.

For example, when the MEMS element 130 includes the first capacitance element 31, the electrical capacitance of the MEMS element 130 can be controlled by breaking the first conductive member 21 that is included in at least one of the multiple element parts 51. As a result, the characteristics of the electrical circuit 210 are controllable.

For example, the electrical circuit 210 may be used in a voltage-controlled oscillator (VCO). For example, the electrical circuit 210 may be used in an impedance matching circuit of a high frequency circuit such as an antenna, etc. For example, the electrical circuit 210 may be used in a passive RF tag. For example, the characteristics of the electrical circuit 210 can be appropriately adjusted by adjusting an electrical capacitance or an inductor of the electrical circuit 210. For example, a voltage-controlled oscillator (VCO) that has stable characteristics is obtained. For example, stable characteristics are obtained in the impedance matching circuit of a high frequency circuit such as an antenna, etc. For example, a passive RF tag or the like that has stable characteristics is obtained.

Figure 13:
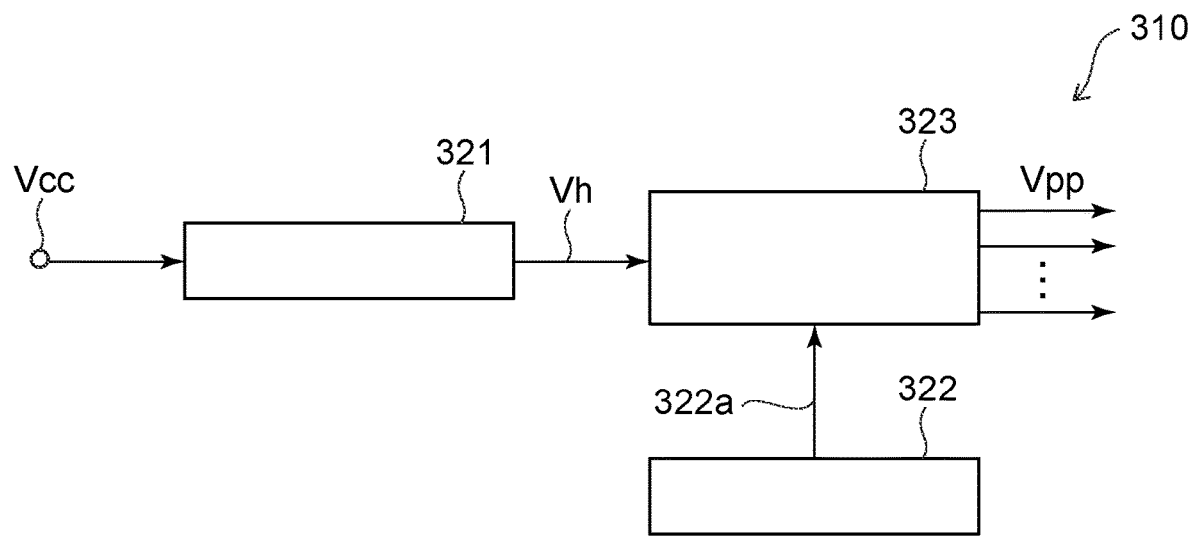
FIG. 13 is a schematic view illustrating a control circuit used in the MEMS element according to the embodiment.
Figure 14:
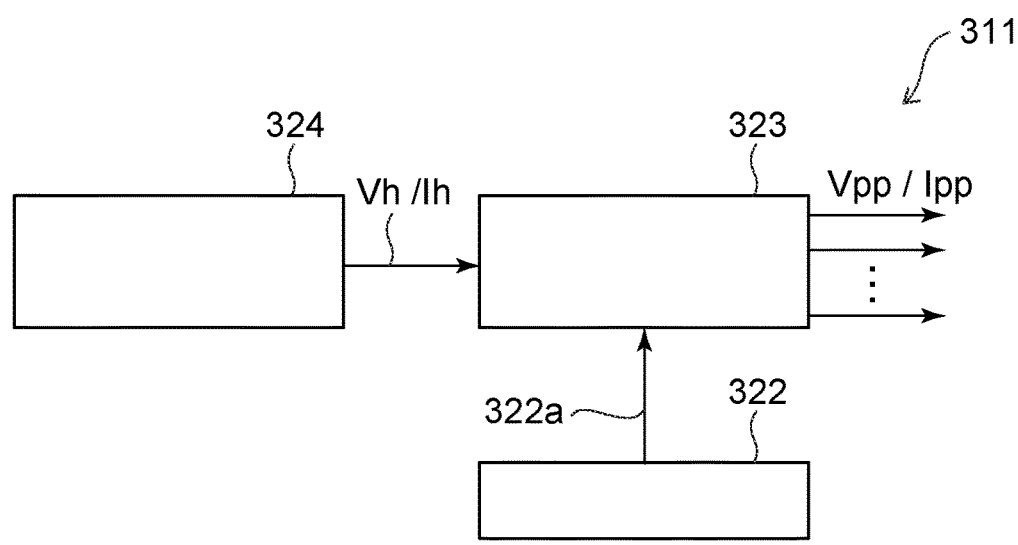
FIG. 14 is a schematic view illustrating a control circuit used in the MEMS element according to the embodiment.

FIGS. 13 and 14 are schematic views illustrating control circuits used in the MEMS element according to the embodiment.

As shown in FIG. 13, a control circuit 310 includes a voltage step-up circuit 321, a logic circuit 322, and a switching matrix 323. A power supply voltage Vcc is supplied to the voltage step-up circuit 321. The voltage step-up circuit 321 outputs a high voltage Vh to the switching matrix 323. The switching matrix 323 outputs multiple control signals Vpp according to a signal 322a that is supplied from the logic circuit 322 to the switching matrix 323. One of the multiple control signals Vpp is supplied to one of the multiple element parts 51.

As shown in FIG. 14, a control circuit 311 includes a control power supply 324, the logic circuit 322, and the switching matrix 323. The control power supply 324 is, for example, a control voltage source or a control current source. The control power supply 324 outputs, to the switching matrix 323, the high voltage Vh and a large current Ih. The switching matrix 323 outputs the multiple control signals Vpp according to the signal 322a that is supplied from the logic circuit 322 to the switching matrix 323. One of the multiple control signals Vpp is supplied to one of the multiple element parts 51. The switching matrix 323 may output multiple control currents Ipp. One of the multiple control currents Ipp is supplied to one of the multiple element parts 51.

For example, at least a portion of the control circuits 310 and 311 is included in, for example, the controller 70.

Embodiments may include the following configurations (e.g., technological proposals).

Configuration 1

A MEMS element, comprising:
a first member; and
an element part,
the element part including
a first fixed electrode fixed to the first member,
a first movable electrode facing the first fixed electrode,
a first conductive member electrically connected with the first movable electrode, and
a second conductive member electrically connected with the first movable electrode,
the first movable electrode being supported by the first and second conductive members to be separated from the first fixed electrode in a first state before a first electrical signal is applied between the second conductive member and the first fixed electrode,
the first conductive member being separated from the first movable electrode in a second state after the first electrical signal is applied between the second conductive member and the first fixed electrode,
the first movable electrode being supported by the second conductive member to be separated from the first fixed electrode in the second state.

Configuration 2

The MEMS element according to Configuration 1, wherein
the first movable electrode is between the first conductive member and the second conductive member in a second direction crossing a first direction, and
the first direction is from the first fixed electrode toward the first movable electrode.

Configuration 3

The MEMS element according to Configuration 1, wherein
the first movable electrode includes a first connection part connected with the first conductive member, and a second connection part connected with the second conductive member,
a direction from the first connection part toward the second connection part is along a second direction crossing a first direction,
the first direction is from the first fixed electrode toward the first movable electrode,
a width of the first movable electrode along a third direction increases in an orientation from the first connection part toward the second connection part in at least a portion of the first movable electrode, and
the third direction crosses a plane including the first and second directions.

Configuration 4

The MEMS element according to Configuration 1, wherein
the first movable electrode includes a first connection part connected with the first conductive member, and a second connection part connected with the second conductive member,
a direction from the first connection part toward the second connection part is along a second direction crossing a first direction,
the first direction is from the first fixed electrode toward the first movable electrode,
the first fixed electrode includes a first fixed end portion and a second fixed end portion,
a position in the second direction of the second fixed end portion is between a position in the second direction of the first fixed end portion and a position in the second direction of the second connection part, and
a first distance along the second direction between the first fixed end portion and the first connection part is less than a second distance along the second direction between the second fixed end portion and the second connection part.

Configuration 5

The MEMS element according to any one of Configurations 1 to 4, wherein
the element part further includes a first supporter and a second supporter,
the first and second supporters are fixed to the first member,
in the first state:
one end portion of the first conductive member is connected with the first movable electrode;
an other end portion of the first conductive member is connected to the first supporter; and
the first conductive member is supported by the first supporter to be separated from the first member, and
in the first state:
one end portion of the second conductive member is connected with the first movable electrode;
an other end portion of the second conductive member is connected to the second supporter; and
the second conductive member is supported by the second supporter to be separated from the first member.

Configuration 6

The MEMS element according to Configuration 5, wherein
the element part further includes a third supporter fixed to the first member,
the first movable electrode includes:
a first electrode region connected with the first conductive member in the first state,
a second electrode region connected with the second conductive member in the first state, and
a first middle region,
a position of the first middle region in the second direction is between a position of the first electrode region in the second direction and a position of the second electrode region in the second direction, and
the first middle region is supported by the third supporter to be separated from the first member.

Configuration 7

The MEMS element according to Configuration 6, wherein
the element part further includes a fourth supporter fixed to the first member,
at least a portion of the first middle region is between the third supporter and the fourth supporter in a third direction,
the third direction crosses a plane including the first and second directions, and
the first middle region is supported by the fourth supporter to be separated from the first member.

Configuration 8

The MEMS element according to any one of Configurations 1 to 7, wherein
the element part further includes a second fixed electrode fixed to the first member,
the first movable electrode includes a first electrode region and a second electrode region, a distance between the first electrode region and the first conductive member is less than a distance between the second electrode region and the first conductive member, the first electrode region faces the first fixed electrode, the second electrode region faces the second fixed electrode, and the first movable electrode is supported by the first and second conductive members to be separated from the second fixed electrode.

Configuration 9

A MEMS element, comprising:

a first member; and an element part, the element part including a first fixed electrode fixed to the first member, a first movable electrode facing the first fixed electrode, a first conductive member electrically connected with the first movable electrode, and a second conductive member electrically connected with the first movable electrode, the first movable electrode including a first connection part connected with the first conductive member, and a second connection part connected with the second conductive member, a direction from the first connection part toward the second connection part being along a second direction crossing a first direction, the first direction being from the first fixed electrode toward the first movable electrode, the first fixed electrode including a first fixed end portion and a second fixed end portion, a position in the second direction of the second fixed end portion being between a position in the second direction of the first fixed end portion and a position in the second direction of the second connection part.

Configuration 10

The MEMS element according to Configuration 9, wherein a first distance along the second direction between the first fixed end portion and the first connection part is less than a second distance along the second direction between the second fixed end portion and the second connection part.

Configuration 11

The MEMS element according to Configuration 9 or 10, wherein the first movable electrode is supported by the first and second conductive members to be separated from the first fixed electrode in a first state before a first electrical signal is applied between the second conductive member and the first fixed electrode, the first conductive member is separated from the first movable electrode in a second state after the first electrical signal is applied between the second conductive member and the first fixed electrode, and the first movable electrode is supported by the second conductive member to be separated from the first fixed electrode in the second state.

Configuration 12

The MEMS element according to Configuration 9 or 10, wherein the first movable electrode is supported by the first and second conductive members to be separated from the first fixed electrode in a first state before a first electrical signal is applied between the second conductive member and the first fixed electrode, and the first conductive member and the second conductive member are separated from the first movable electrode in a second state after the first electrical signal is applied between the second conductive member and the first fixed electrode.

Configuration 13

A MEMS element, comprising:

a first member; and an element part, the element part including a first fixed electrode fixed to the first member, a first movable electrode facing the first fixed electrode, a first conductive member electrically connected with the first movable electrode, and a second conductive member electrically connected with the first movable electrode, the first movable electrode being between the first conductive member and the second conductive member in a second direction crossing a first direction, the first direction being from the first fixed electrode toward the first movable electrode, the first movable electrode including a first connection part connected with the first conductive member, and a second connection part connected with the second conductive member, a width of the first movable electrode along the second direction increasing in an orientation from the first connection part toward the second connection part in at least a portion of the first movable electrode.

Configuration 14

The MEMS element according to Configuration 13, wherein the at least a portion of the first movable electrode includes a side portion oblique to the second direction.

Configuration 15

The MEMS element according to any one of Configurations 1 to 14, wherein a rigidity of the first conductive member is less than a rigidity of the second conductive member.

Configuration 16

The MEMS element according to any one of Configurations 1 to 15, wherein a first width of at least a portion of the first conductive member is less than a second width of at least a portion of the second conductive member.

Configuration 17

The MEMS element according to Configuration 16, wherein the first width is not more than 0.5 times the second width.

Configuration 18

The MEMS element according to any one of Configurations 1 to 17, wherein a first thickness of the first conductive member is less than a second thickness of the second conductive member.

Configuration 19

A MEMS element, comprising:

a first member; and an element part, the element part including a first fixed electrode fixed to the first member, a first movable electrode facing the first fixed electrode, a first conductive member electrically connected with the first movable electrode, a first supporter supporting the first conductive member, and a second supporter supporting the first movable electrode, the second supporter being electrically connected with the first movable electrode, the first movable electrode being supported by the first conductive member and the second supporter to be separated from the first fixed electrode in a first state before a first electrical signal is applied between the second supporter and the first fixed electrode, the first conductive member being separated from the first movable electrode in a second state after the first electrical signal is applied between the second supporter and the first fixed electrode, the first movable electrode being supported by the second supporter to be separated from the first fixed electrode in the second state.

Configuration 20

An electrical circuit, comprising:

the MEMS element according to any one of Configurations 1 to 19; and an electrical element electrically connected with the MEMS element.

According to embodiments, a MEMS element and an electrical circuit can be provided in which stable operations are possible.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in MEMS elements and electrical circuits such as first members, element parts, fixed electrodes, movable electrodes, first conductive members, second conductive members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all MEMS elements, and electrical circuits practicable by an appropriate design modification by one skilled in the art based on the MEMS elements, and the electrical circuits described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A MEMS element, comprising:

a first member; and an element part, the element part including
a first fixed electrode fixed to the first member,
a first movable electrode facing the first fixed electrode,
a first conductive member electrically connected with the first movable electrode, and
a second conductive member electrically connected with the first movable electrode, the first movable electrode being supported by the first and second conductive members to be separated from the first fixed electrode in a first state before a first electrical signal is applied between the second conductive member and the first fixed electrode, the first conductive member being separated from the first movable electrode in a second state after the first electrical signal is applied between the second conductive member and the first fixed electrode, the first movable electrode being supported by the second conductive member to be separated from the first fixed electrode in the second state.

2. The MEMS element according to claim 1, wherein
the first movable electrode is between the first conductive member and the second conductive member in a second direction crossing a first direction, and
the first direction is from the first fixed electrode toward the first movable electrode.

3. The MEMS element according to claim 1, wherein
the first movable electrode includes a first connection part connected with the first conductive member, and a second connection part connected with the second conductive member,
a direction from the first connection part toward the second connection part is along a second direction crossing a first direction,
the first direction is from the first fixed electrode toward the first movable electrode,
a width of the first movable electrode along a third direction increases in an orientation from the first connection part toward the second connection part in at least a portion of the first movable electrode, and
the third direction crosses a plane including the first and second directions.

4. The MEMS element according to claim 1, wherein
the first movable electrode includes a first connection part connected with the first conductive member, and a second connection part connected with the second conductive member,
a direction from the first connection part toward the second connection part is along a second direction crossing a first direction,
the first direction is from the first fixed electrode toward the first movable electrode,
the first fixed electrode includes a first fixed end portion and a second fixed end portion,
a position in the second direction of the second fixed end portion is between a position in the second direction of the first fixed end portion and a position in the second direction of the second connection part, and
a first distance along the second direction between the first fixed end portion and the first connection part is less than a second distance along the second direction between the second fixed end portion and the second connection part.

5. The MEMS element according to claim 1, wherein
the element part further includes a first supporter and a second supporter,
the first and second supporters are fixed to the first member,
in the first state:
  one end portion of the first conductive member is connected with the first movable electrode;
  an other end portion of the first conductive member is connected to the first supporter; and
  the first conductive member is supported by the first supporter to be separated from the first member, and
in the first state:
  one end portion of the second conductive member is connected with the first movable electrode;
  an other end portion of the second conductive member is connected to the second supporter; and
  the second conductive member is supported by the second supporter to be separated from the first member.

6. The MEMS element according to claim 5, wherein
the element part further includes a third supporter fixed to the first member,
the first movable electrode includes:
  a first electrode region connected with the first conductive member in the first state,
  a second electrode region connected with the second conductive member in the first state, and
  a first middle region,
a position of the first middle region in the second direction is between a position of the first electrode region in the second direction and a position of the second electrode region in the second direction, and
the first middle region is supported by the third supporter to be separated from the first member.

7. The MEMS element according to claim 6, wherein
the element part further includes a fourth supporter fixed to the first member,
at least a portion of the first middle region is between the third supporter and the fourth supporter in a third direction,
the third direction crosses a plane including the first and second directions, and
the first middle region is supported by the fourth supporter to be separated from the first member.

8. The MEMS element according to claim 1, wherein
the element part further includes a second fixed electrode fixed to the first member,
the first movable electrode includes a first electrode region and a second electrode region,
a distance between the first electrode region and the first conductive member is less than a distance between the second electrode region and the first conductive member,
the first electrode region faces the first fixed electrode,
the second electrode region faces the second fixed electrode, and
the first movable electrode is supported by the first and second conductive members to be separated from the second fixed electrode.

9. A MEMS element, comprising:
a first member; and
an element part,
the element part including
  a first fixed electrode fixed to the first member,
  a first movable electrode facing the first fixed electrode,
  a first conductive member electrically connected with the first movable electrode, and
  a second conductive member electrically connected with the first movable electrode,
the first movable electrode including a first connection part connected with the first conductive member, and a second connection part connected with the second conductive member,
a direction from the first connection part toward the second connection part being along a second direction crossing a first direction,
the first direction being from the first fixed electrode toward the first movable electrode,
the first fixed electrode including a first fixed end portion and a second fixed end portion,
a position in the second direction of the second fixed end portion being between a position in the second direction of the first fixed end portion and a position in the second direction of the second connection part,
wherein
  the first movable electrode is supported by the first and second conductive members to be separated from the first fixed electrode in a first state before a first electrical signal is applied between the second conductive member and the first fixed electrode,
  the first conductive member is separated from the first movable electrode in a second state after the first electrical signal is applied between the second conductive member and the first fixed electrode, and
  the first movable electrode is supported by the second conductive member to be separated from the first fixed electrode in the second state.

10. The MEMS element according to claim 9, wherein
a first distance along the second direction between the first fixed end portion and the first connection part is less than a second distance along the second direction between the second fixed end portion and the second connection part.

11. A MEMS element, comprising:
a first member; and
an element part,
the element part including
  a first fixed electrode fixed to the first member,
  a first movable electrode facing the first fixed electrode,
  a first conductive member electrically connected with the first movable electrode, and
  a second conductive member electrically connected with the first movable electrode,
the first movable electrode including a first connection part connected with the first conductive member, and a second connection part connected with the second conductive member,
a direction from the first connection part toward the second connection part being along a second direction crossing a first direction,
the first direction being from the first fixed electrode toward the first movable electrode,
the first fixed electrode including a first fixed end portion and a second fixed end portion,
a position in the second direction of the second fixed end portion being between a position in the second direction of the first fixed end portion and a position in the second direction of the second connection part,
wherein
  the first movable electrode is supported by the first and second conductive members to be separated from the first fixed electrode in a first state before a first electrical signal is applied between the second conductive member and the first fixed electrode, and the first movable electrode is electrically connected with the first and second conductive members in the first state, and the first conductive member and the second conductive member are separated from the first movable electrode in a second state after the first electrical signal is applied between the second conductive member and the first fixed electrode and the first movable electrode is electrically isolated from the first and second conductive members in the second state.

12. The MEMS element according to claim 1, wherein a rigidity of the first conductive member is less than a rigidity of the second conductive member.

13. The MEMS element according to claim 1, wherein a first width of at least a portion of the first conductive member is less than a second width of at least a portion of the second conductive member.

14. The MEMS element according to claim 13, wherein the first width is not more than 0.5 times the second width.

15. The MEMS element according to claim 1, wherein a first thickness of the first conductive member is less than a second thickness of the second conductive member.

16. An electrical circuit, comprising:
the MEMS element according to claim 1; and
an electrical element electrically connected with the MEMS element.

\* \* \* \* \*